United States Patent
Sugie (10) Patent No.: US 12,556,082 B2
(45) Date of Patent: Feb. 17, 2026

(54) DRIVING CIRCUIT OF BRIDGE CIRCUIT

(71) Applicant: ROHM CO., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 138 days.

(21) Appl. No.: 18/530,608

(22) Filed: Dec. 6, 2023

(65) Prior Publication Data

US 2024/0113614 A1    Apr. 4, 2024

Related U.S. Application Data (63) Continuation of application No. PCT/JP2022/019140, filed on Apr. 27, 2022.

(30) Foreign Application Priority Data

Jun. 7, 2021   (JP) .................. 2021-095451

(51) Int. Cl.
*H02M 1/00*    (2007.01)
*H03K 17/687*    (2006.01)

(52) U.S. Cl.
CPC ........ *H02M 1/0085* (2021.05); *H03K 17/687* (2013.01); *H03K 2217/0063* (2013.01)

(58) Field of Classification Search
CPC .............. H02M 1/0085; H03K 17/687; H03K 2217/0063
See application file for complete search history.

(56) References Cited

U.S. PATENT DOCUMENTS

| 10,186,946 B2 * | 1/2019 | Araki ................. H02M 1/08 |
| 10,608,631 B2 * | 3/2020 | Sugie ................. H03K 17/162 |
| 2021/0105013 A1 * | 4/2021 | Sugie ................. H03K 17/687 |

FOREIGN PATENT DOCUMENTS

| JP | 2018082575 A | 5/2018 |
| JP | 2018182818 A | 11/2018 |

OTHER PUBLICATIONS

International Search Report and Written Opinion from International Application No. PCT/JP2022/019140; mailed August 9. 2022; 21 pages.
JPO Notification of Reason(s) for Refusal for corresponding JP Application No. 2023-527559 issued Aug. 26, 2025.

* cited by examiner

*Primary Examiner* — Menatoallah Youssef
*Assistant Examiner* — Colleen J O Toole
(74) *Attorney, Agent, or Firm* — CANTOR COLBURN LLP (57) ABSTRACT

An output node of a high-side driver circuit is coupled to the gate of a high-side transistor. The high-side driver circuit is structured to operate in a first mode in which the high-side driver circuit outputs a driving current with a first current amount during a first period from the transition of a high-side control signal HGCTL from the off level to the on level, and outputs the driving current with a second current amount that is smaller than the first current amount during a second period subsequent to the first period.

19 Claims, 8 Drawing Sheets

DRIVING CIRCUIT OF BRIDGE CIRCUIT

CROSS REFERENCE TO RELATED APPLICATIONS

This application is a continuation under 35 U.S.C. § 120 of PCT/JP2022/019140, filed Apr. 27, 2022, which is incorporated herein by reference, and which claimed priority to Japan Application No. 2021-095451, filed Jun. 7, 2021. The present application likewise claims priority under 35 U.S.C. § 119 to Japanese Application No. 2021-095451 filed Jun. 7, 2021, the entire content of which is also incorporated herein by reference

BACKGROUND

1. Technical Field

The present disclosure relates to a driving circuit of a bridge circuit.

2. Related Art

Circuits such as motor driver circuit, DC/DC converter, power conversion apparatus, etc., employ a half-bridge circuit, an H-bridge-circuit, or a three-phase bridge circuit (which will be collectively referred to as a "bridge circuit" hereafter) having a power transistor.

Figure 1:
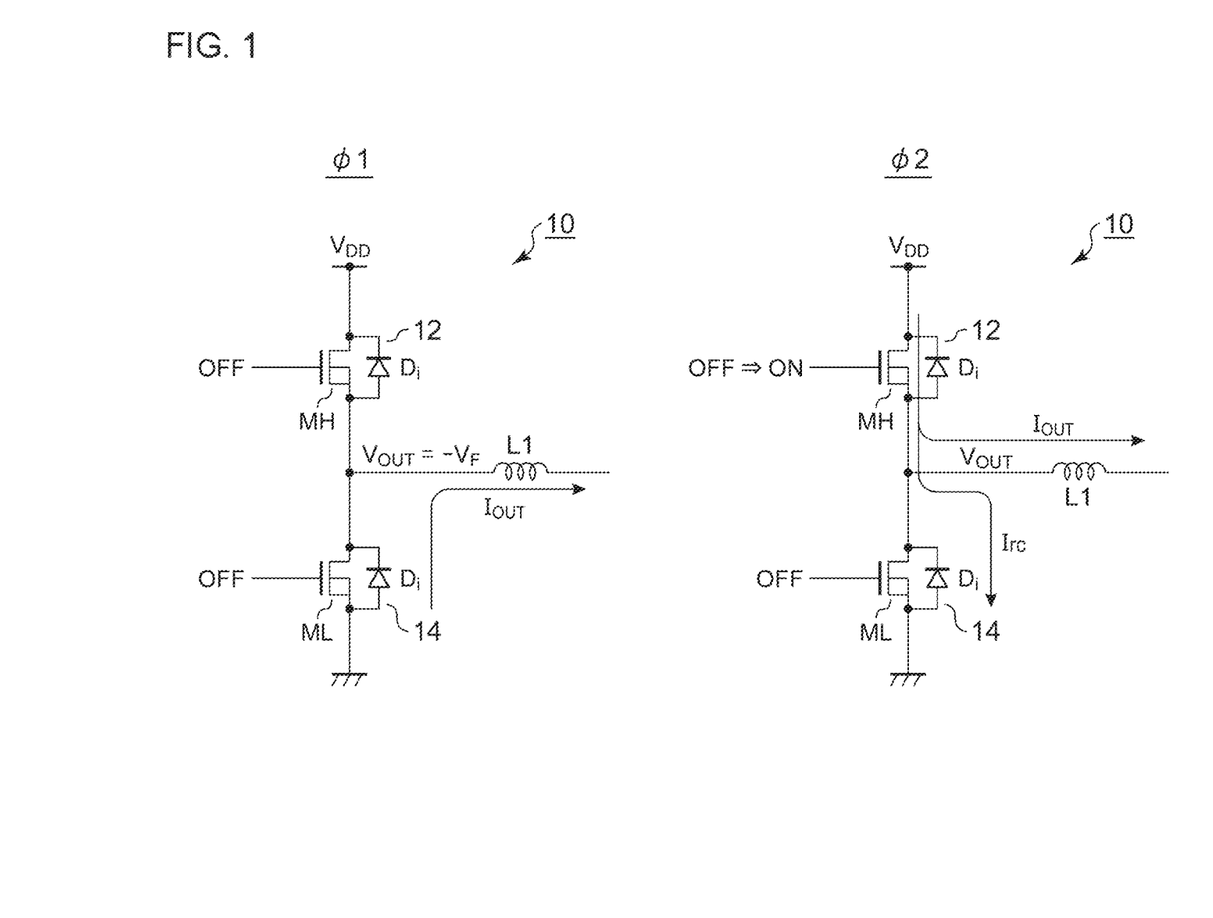
FIG. 1 is a circuit diagram of a bridge circuit.

FIG. 1 is a circuit diagram of a bridge circuit 10. The bridge circuit 10 includes an upper arm 12 and a lower arm 14 arranged in series between a power supply terminal and a ground terminal. The upper arm 12 includes a high-side transistor MH and a flywheel diode Di coupled in parallel. The lower arm 14 includes a low-side transistor ML and a flywheel diode Di coupled in parallel. An inductor (coil) that functions as a load is coupled to an output terminal of the bridge circuit 10.

The bridge circuit 10 is settable to a state (high-impedance state) φ1 in which both the high-side transistor MH and the low-side transistor ML are turned off, a state (high-output state) φ2 in which the high-side transistor MH is turned on and the low-side transistor ML is turned off, a state (low-output state) in which the high-side transistor MH is turned off and the low-side transistor ML is turned on. Each of the states φ1 through φ3 has a current source state (current flows toward the right in the drawing) in which the bridge circuit 10 outputs a current $I_{OUT}$ and a current sink state (current flows toward the left in the drawing) in which the current $I_{OUT}$ is drawn by the bridge circuit 10.

As a result of investigating the bridge circuit shown in FIG. 1, the present inventor has come to recognize the following problems.

Let us consider a case in which the state is switched from the high-impedance state φ1 to the high-output state φ2. In the state φ1, the output current $I_{OUT}$ is supplied to a load via the flywheel diode Di of the lower arm 14 (current source). In the state φ1, the output voltage $V_{OUT}$ is set to −Vf Here, Vf represents the forward voltage of the flywheel diode Di.

In the state φ2, the output current $I_{OUT}$ of the bridge circuit 10 flows through the high-side transistor MH. Furthermore, a reverse recovery current Irc flows through the flywheel diode Di of the lower arm 14 from the cathode to the anode. Accordingly, both the output current $I_{OUT}$ and the reverse recovery current Irc flow through the high-side transistor MH. This state is equivalent to through current flowing. In a case in which such through current flows, this leads to an unstable state of the output voltage $V_{OUT}$ of the bridge circuit 10, resulting in the occurrence of ringing. Such ringing is undesired because it becomes a cause of unnecessary radiation.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

Description will be made regarding the outline of several exemplary embodiments of the present disclosure. The outline is a simplified explanation regarding several concepts of one or multiple embodiments as a preface to the detailed description described later in order to provide a basic understanding of the embodiments. That is to say, the outline described below is by no means intended to restrict the scope of the present invention and the present disclosure. For convenience, in some cases, an "embodiment" as used in the present specification represents a single or multiple embodiments (examples and modifications) disclosed in the present specification.

The outline is by no means a comprehensive outline of all possible embodiments. That is to say, the outline is by no means intended to identify the indispensable or essential elements of all the embodiments and is by no means intended to define the scope of a part of or all the embodiments. The sole purpose of the outline is to present several concepts of one or multiple embodiments in a simple form as a prelude to the detailed description described later.

A driving circuit according to one embodiment is configured to drive a bridge circuit. The bridge circuit includes an upper arm including a high-side transistor and a flywheel diode coupled in parallel between a power supply line and an output line and a lower arm including a low-side transistor and a flywheel diode coupled in parallel between the output line and a ground line. The driving circuit includes a high-side driver circuit having an output node coupled to a gate of the high-side transistor, and structured to operate in a first mode in which the high-side driver circuit outputs a driving current with a first current amount during a first period from the transition of a high-side control signal from an off level to an on level, and outputs the driving current with a second current amount that is smaller than the first current amount during a second period subsequent to the first period.

With this arrangement, the driving current with a first current amount is supplied to the gate of the high-side transistor in the first period immediately before the high-side transistor is turned on, so as to increase the gate voltage. Subsequently, during the second period in which a reverse recovery current can flow through the flywheel diode of the lower arm, the driving current to be supplied to the gate of the high-side transistor is reduced so as to gradually turn on the high-side transistor while maintaining the on resistance of the high-side transistor at a large resistance value. This is capable of suppressing the occurrence of through current and ringing due to the reverse recovery current of the flywheel diode of the lower arm.

In one embodiment, the driving circuit may further include a first sensor structured to compare a gate-source voltage of the high-side transistor with a first threshold voltage. The high-side driver circuit may transit to the second period in response to a change in output of the first sensor in the first period. With such an arrangement in which the gate-source voltage of the high-side transistor is monitored, such an arrangement is capable of changing the amount of the driving current according to the transition of the high-side transistor from the off state to the on state. The first threshold voltage may be equal to, higher than, or lower than the gate threshold of the MOSFET.

In one embodiment, the first sensor may be configured as a sensor that is shared with a high-side off sensor for detecting whether or not the high-side transistor turns off. This allows the driving current to be reduced before the high-side transistor becomes the on state. Furthermore, this allows an increase in the circuit area to be suppressed.

In one embodiment, in a third period subsequent to the second period, the high-side driver circuit may output the driving current with a third current amount that is larger than the second current amount. With such an arrangement in which the output current of the high-side driver circuit is increased after the effects of the reverse recovery characteristics of the flywheel diode of the lower arm become small, this is capable of reducing the on resistance of the high-side transistor in a short period of time, thereby providing the bridge circuit with improved efficiency.

In one embodiment, the driving circuit may further include a second sensor structured to compare an output voltage of the output line with an upper-side threshold voltage. Also, the high-side driver circuit may transit to the third period in response to a change in output of the second sensor in the second period. With such an arrangement in which the output voltage is monitored, this is capable of detecting whether or not the effects of the reverse recovery characteristics of the flywheel diode of the lower arm become small.

In one embodiment, in a case in which the high-side transistor is to be turned on in a state in which both the high-side transistor and the low-side transistor are turned off, and a current is supplied as a source current via a flywheel diode of the lower arm, the high-side driver circuit may operate in the first mode.

In one embodiment, the high-side driver circuit may include a first switch coupled between a gate and source of the high-side transistor, and structured to turn on after completion of a state transition of the bridge circuit. By turning on the first switch, such an arrangement is capable of fixing the high-side transistor to the on state.

In one embodiment, in addition to the first mode, the high-side driver circuit may be capable of operating in a second mode. In the second mode, the high-side driver circuit outputs the driving current with a constant amount that is larger than the second current amount during a period from the transition of the high-side control signal from the off level to the on level until the completion of the state transition of the bridge circuit. In the transition from an initial state in which no current flows through the flywheel diode of the lower arm, there is no effect of a reverse recovery current. In this case, by selecting the second mode which provides high driving performance instead of the first mode, such an arrangement is capable of reducing the on resistance of the high-side transistor in a short period of time, thereby providing improved efficiency.

In one embodiment, in a case in which the high-side transistor is to be turned on in a state in which the high-side transistor is turned off and the low-side transistor is turned on, and a current is sunk via the low-side transistor, the high-side driver circuit may operate in the second mode.

The driving circuit according to one embodiment further includes a low-side driver circuit including an output node coupled to a gate of the low-side transistor, and structured to be capable of operating in a first mode in which the low-side driver circuit outputs a driving current with a fourth current amount during a fourth period from the transition of a low-side control signal from an off level to an on level, and outputs the driving current with a fifth current amount that is smaller than the fourth current amount in a fifth period subsequent to the fourth period.

With this arrangement, the driving current with a fourth current amount is supplied to the gate of the low-side transistor in the fourth period immediately before the low-side transistor is turned on, so as to increase the gate voltage. Subsequently, during the fifth period in which a reverse recovery current can flow through the flywheel diode of the upper arm, the driving current to be supplied to the gate of the low-side transistor is reduced so as to gradually turn on the low-side transistor while maintaining the on resistance of the low-side transistor at a large resistance value. This is capable of suppressing the occurrence of through current and ringing due to the reverse recovery current of the flywheel diode of the upper arm.

In one embodiment, the driving circuit may further include a third sensor structured to compare a gate-source voltage of the low-side transistor with a third threshold voltage. Also, the low-side driver circuit may transit to the fifth period in response to a change in output of the third sensor in the fourth period. With such an arrangement in which the gate-source voltage of the low-side transistor is monitored, such an arrangement is capable of changing the amount of the driving current according to the transition of the low-side transistor from the off state to the on state. The second threshold voltage may be equal to, higher than, or lower than the gate threshold of the MOSFET.

In one embodiment, the third sensor may be configured such that it is shared with a low-side off sensor structured to detect whether the low-side transistor has turned off. This allows the driving current to be reduced before the low-side transistor becomes the on state. Furthermore, this is capable of suppressing an increase in the circuit area.

In one embodiment, the low-side driver circuit may output the driving current with a sixth current amount that is larger than the fifth current amount during a sixth period subsequent to the fifth period. With such an arrangement in which the output current of the low-side driver circuit is increased after the effects of the reverse recovery characteristics of the flywheel diode of the upper arm become small, such an arrangement is capable of reducing the on resistance of the low-side transistor in a short period of time, thereby providing the bridge circuit with improved efficiency.

In one embodiment, the driving circuit may further include a fourth sensor structured to compare an output voltage of the output line with a low-side threshold voltage. Also, the low-side driver circuit may transit to the sixth period in response to a change in output of the fourth sensor in the fifth period. With such an arrangement in which the output voltage is monitored, such an arrangement is capable of detecting whether or not the effects of the reverse recovery characteristics of the flywheel diode of the upper arm become small.

In one embodiment, in a case in which the low-side transistor is to be turned on in a state in which both the high-side transistor and the low-side transistor are turned off, and a current is sunk via a flywheel diode of the upper arm, the low-side driver circuit may operate in the first mode.

In one embodiment, the low-side driver circuit may include a second switch coupled between a gate and source of the low-side transistor, and structured to turn on after completion of a state transition of the bridge circuit. By turning on the second switch, such an arrangement is capable of fixing the low-side transistor to the on state.

In one embodiment, in addition to the first mode, the low-side driver circuit may be capable of operating in a second mode. In the second mode, the low-side driver circuit outputs the driving current with a constant amount that is larger than the fifth current amount during a period from the transition of the low-side control signal from the off level to the on level until the completion of the state transition of the bridge circuit. In the transition from an initial state in which no current flows through the flywheel diode of the upper arm, there is no effect of a reverse recovery current. In this case, by selecting the second mode which provides high driving performance instead of the first mode, such an arrangement is capable of reducing the on resistance of the low-side transistor in a short period of time, thereby providing improved efficiency.

In one embodiment, in a case in which the low-side transistor is to be turned on in a state in which the high-side transistor is turned on and the low-side transistor is turned off, and a current is supplied as a source current via the high-side transistor, the low-side driver circuit may operate in the second mode.

Embodiments

Description will be made below regarding preferred embodiments with reference to the drawings. The same or similar components, members, and processes are denoted by the same reference numerals, and redundant description thereof will be omitted as appropriate.

The embodiments have been described for exemplary purposes only and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electrical connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C, via another member that does not substantially affect the electrical connection between them, or that does not damage the functions or effects of the connection between them, in addition to a state in which they are directly coupled.

Figure 2:
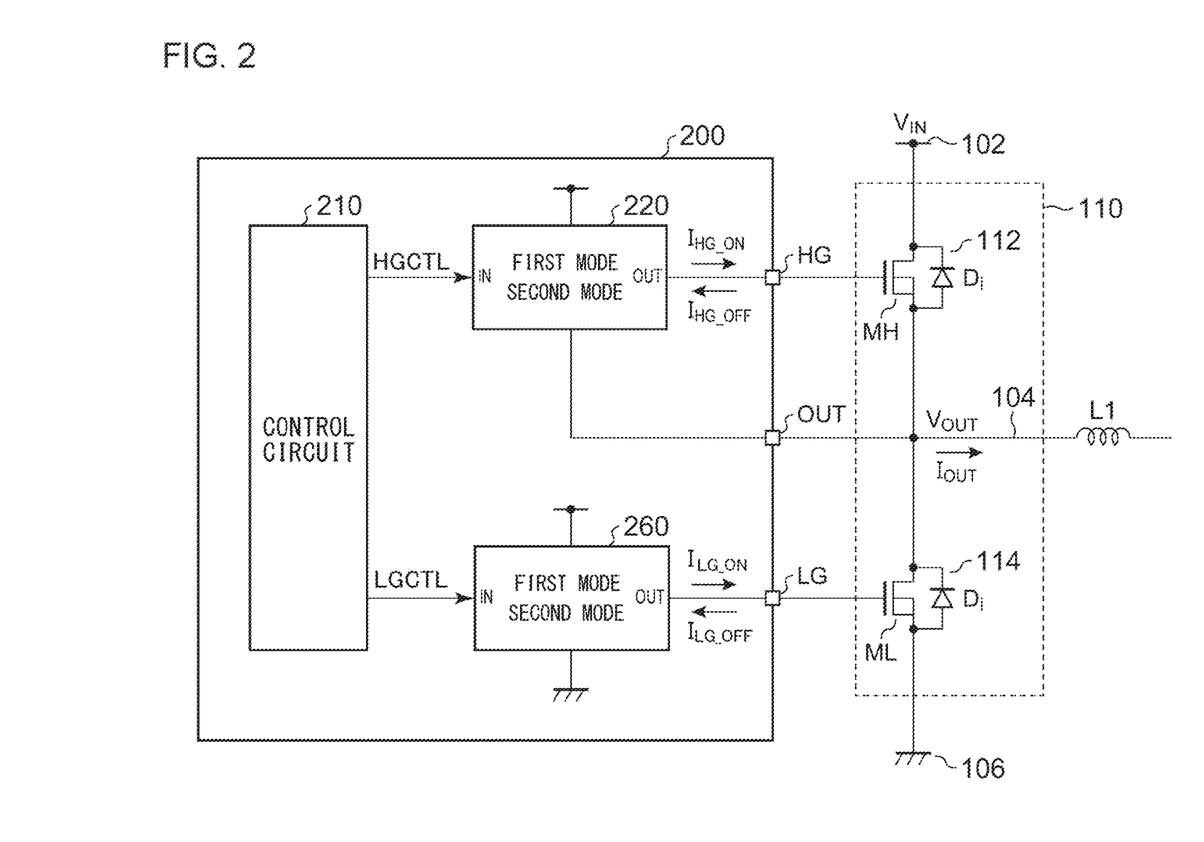
FIG. 2 is a circuit diagram of a switching circuit according to an embodiment.

FIG. 2 is a circuit diagram of a switching circuit 100 according to an embodiment. The switching circuit 100 includes a bridge circuit 110 and a driving circuit 200. Here, the drawing shows only a configuration of a single-phase switching circuit. Also, the switching circuit 100 may be configured as a three-phase switching circuit or an H-bridge circuit.

The bridge circuit 110 includes an upper arm 112 arranged between a power supply line (input line) 102 and an output terminal (output line) 104 and a lower arm 114 arranged between the output line 104 and a ground line 106. The upper arm 112 includes a high-side transistor MH and a flywheel diode (return current diode) Di coupled in parallel. The lower arm 114 includes a low-side transistor ML and a flywheel diode Di coupled in parallel. In the present embodiment, the high-side transistor MH and the low-side transistor ML are each configured as an N-channel MOSFET with a body diode that functions as the corresponding flywheel diode Di.

The driving circuit 200 controls the upper arm 112 and the lower arm 114 of the bridge circuit 110. The driving circuit 200 switches the state between a high-impedance state $\varphi 1$ in which both the upper arm 112 and the lower arm 114 are turned off, a high-output state $\varphi 2$ in which the upper arm 112 is turned on and the lower arm 114 is turned off, and a low-output state $\varphi 3$ in which the upper arm 112 is turned off and the lower arm 114 is turned on. Description will be made regarding the output current $I_{OUT}$ with the direction of flow toward an inductor L1 that is a load as the positive direction and with the opposite direction as the negative direction. The three states $\varphi 1$ through $\varphi 3$ include states $\varphi 1A$ through $\varphi 3A$, respectively, in which the output current $I_{OUT}$ flows in the positive direction (current source). Furthermore, the three states $\varphi 1$ through $\varphi 3$ include states $\varphi 1B$ through $\varphi 3B$, respectively, in which the output current $I_{OUT}$ flows in the negative direction (current sink).

The driving circuit 200 includes a control circuit 210, a high-side driver circuit 220, and a low-side driver circuit 260, which are integrated on a single semiconductor substrate so as to form a function IC. The control circuit 210 selects one from among the states $\varphi 1$ through $\varphi 3$, and generates control signals HGCTL and LGCTL according to the corresponding one of the states $\varphi 1$ through $\varphi 3$ thus selected. In the state $\varphi 1$, both the high-side control signal HGCTL and the low-side control signal LGCTL are set to the off level (e.g., low level). In the state $\varphi 2$, the high-side control signal HGCTL is set to the on level (e.g., high level), and the low-side control signal LGCTL is set to the off level. In the state $\varphi 3$, the high-side control signal HGCTL is set to the off level, and the low-side control signal LGCTL is set to the on level.

The high-side driver circuit 220 is arranged such that the high-side control signal HGCTL is received via its input node IN and its output node OUT is coupled to the gate of the high-side transistor MH. When the high-side control signal HGCTL transits from the off level to the on level, the high-side driver circuit 220 supplies a driving current $I_{HG\_ON}$ to the gate of the high-side transistor MH. This increases the gate-source voltage $V_{GS}$ of the high-side transistor MH, thereby turning on the high-side transistor MH. Conversely, when the high-side control signal HGCTL transits from the on level to the off level, the high-side driver circuit 220 draws the driving current $I_{HG\_OFF}$ from the gate of the high-side transistor MH. This reduces the gate-source voltage $V_{GS}$, thereby turning off the high-side transistor MH.

The high-side driver circuit 220 is capable of selecting one from among multiple operation modes when the high-side transistor MH is to be turned on, one of which will be referred to as a "first mode". In the first mode, the high-side driver circuit 220 changes the driving current $I_{HG\_ON}$ to be supplied to the gate of the high-side transistor MH in multiple steps according to the state of the bridge circuit 110.

In the first mode, the high-side driver circuit 220 outputs the driving current $I_{HG\_ON}$ with a first current amount $I_1$ during a first period $T_1$ subsequent to the high-side control signal HGCTL transits from the off level to the on level. Furthermore, the high-side driver circuit 220 outputs the driving current $I_{HG\_ON}$ with a second current amount $I_2$ that is smaller than the first current amount $I_1$ during a second period $T_2$ subsequent to the first period $T_1$. Furthermore, the high-side driver circuit 220 outputs the driving current $I_{HG\_ON}$ with a third current amount $I_3$ that is larger than the second current amount $I_2$ during a third period $T_3$ subsequent to the second period $T_2$. The third current amount $I_3$ may be equal to, higher than, or lower than first current amount $I_1$.

The high-side driver circuit 220 is configured to support an operation in a second mode in addition to the first mode. In the second mode, the high-side driver circuit 220 generates the driving current $I_{HG\_ON}$ having a waveform that differs from that in the first mode. Specifically, in the second mode, the driving current $I_{HG\_ON}$ has a constant current amount Ic that is larger than the second current amount $I_2$ during a period from the transition of the high-side control signal HGCTL from the off level to the on level until the completion of the state transition of the bridge circuit 110. The constant amount Ic may be larger than each of the first current amount $I_1$ through the third current amount $I_3$.

The low-side driver circuit 260 is arranged such that its input node IN receives the low-side control signal LGCTL and its output node OUT is coupled to the gate of the low-side transistor ML. When the low-side control signal LGCTL transits from the off level (e.g., low level) to the on level (high level), the low-side driver circuit 260 supplies the driving current $I_{LG\_ON}$ to the gate of the low-side transistor ML so as to increase the gate-source voltage $V_{GS}$ of the low-side transistor ML, thereby turning on the low-side transistor ML. Conversely, when the low-side control signal LGCTL transits from the on level to the off level, the low-side driver circuit 260 draws the driving current $I_{LG\_OFF}$ from the gate of the low-side transistor ML. This reduces the gate-source voltage $V_{GS}$, thereby turning off the low-side transistor ML.

As with the high-side driver circuit 220, the low-side driver circuit 260 is configured to be switchable between the first mode and the second mode.

In the first mode, the low-side driver circuit 260 changes the driving current $I_{LG\_ON}$ to be supplied to the gate of the low-side transistor ML in multiple steps according to the state of the bridge circuit 110.

In the first mode, the low-side driver circuit 260 outputs the driving current $I_{LG\_ON}$ with a fourth current amount $I_4$ during a fourth period $T_4$ from the transition of the low-side control signal LGCTL from the off level to the on level. During a fifth period $T_5$ subsequent to the fourth period $T_4$, the low-side driver circuit 260 outputs the driving current $I_{LG\_ON}$ with a fifth current amount $I_5$ that is smaller than the fourth current amount $I_4$. Subsequently, during a sixth period $T_6$ subsequent to the fifth period $T_5$, the low-side driver circuit 260 outputs the driving current $I_{LG\_ON}$ with a sixth current amount $I_6$ that is larger than the fifth current amount $I_5$. The sixth current amount $I_6$ may be smaller than, equal to, or larger than the fourth current amount 14.

In the second mode, the low-side driver circuit 260 generates the driving current $I_{LG\_ON}$ having a waveform that differs from that in the first mode. Specifically, in the second mode, during a period from the transition of the low-side control signal LGCTL from the off level to the on level until the completion of the state transition of the bridge circuit 110, the driving current $I_{LG\_ON}$ has a constant amount Id that is larger than the fifth current amount $I_5$. The constant amount Id may be larger than each of the fourth current amount $I_4$ through the sixth current amount $I_6$.

The above is the configuration of the switching circuit 100. Next, description will be made regarding the operation thereof.

First, description will be made regarding the operation of the high-side driver circuit 220. In a situation in which a reverse recovery current of the flywheel diode of the lower arm 114 has the potential to occur, the high-side driver circuit 220 operates in the first mode. Conversely, in a situation in which a reverse recovery current of the flywheel diode has no potential to occur, the high-side driver circuit 220 operates in the second mode.

Specifically, the high-side driver 220 operates in the first mode in a situation (source-rise situation) in which the high-side transistor MH is to be turned on in the state φ1A in which the high-side transistor MH and the low-side transistor ML are turned off, and the current $I_{OUT}$ is supplied as a source current via the flywheel diode Di of the lower arm 114.

Furthermore, the high-side driver 220 operates in the second mode in a situation (sink-rise situation) in which the high-side transistor MH is to be turned on in the state in which the high-side transistor MH is turned off and the low-side transistor ML is turned on, and the current $I_{OUT}$ is sunk via the low-side transistor ML.

Figure 3:
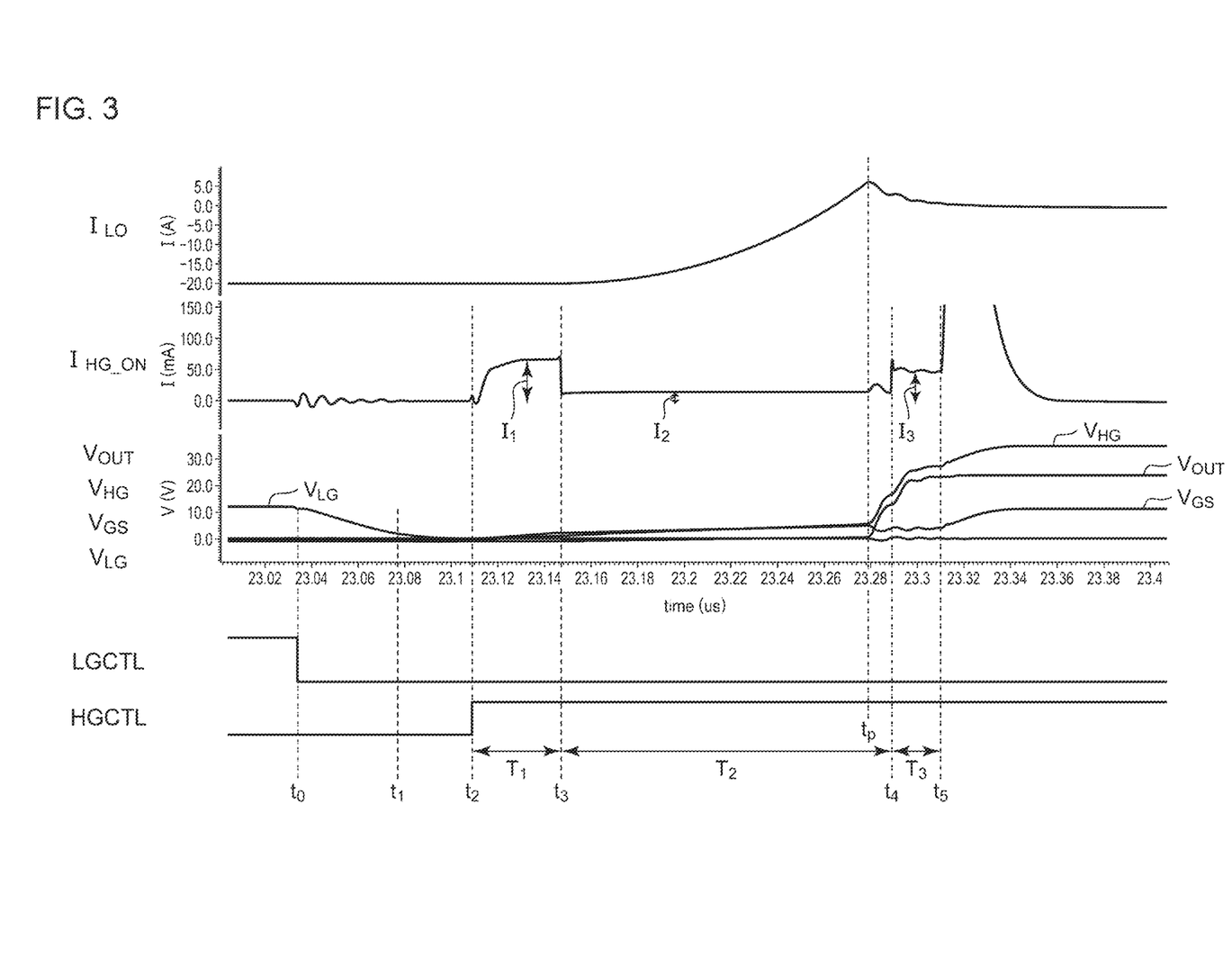
FIG. 3 is a waveform diagram (simulation results) of the operation of the switching circuit shown in FIG. 2 in a source-rise situation.

FIG. 3 is a waveform diagram (simulation results) of the operation of the switching circuit 100 shown in FIG. 2 in the source-rise situation. FIG. 3 shows the current $I_{LO}$ that flows through the lower arm 114, the driving current $I_{HG\_ON}$, which is the output of the high-side driver circuit 220, the output voltage $V_{OUT}$, the gate voltage $V_{HG}$ of the high-side transistor MH, the gate-source voltage $V_{GS}$ of the high-side transistor MH, and the gate voltage $V_{LG}$ of the low-side transistor ML.

Before the time point to, the low-side control signal LGCTL is at the on level (high). Accordingly, the gate voltage $V_{LG}$ of the low-side transistor ML is set to the high level (e.g., 12 V), thereby turning on the low-side transistor ML.

In this state, the current $I_{LO}$ flows through the lower arm 114 in the negative direction. The state in which the current $I_{LO}$ flows in the negative direction represents a state in which the current $I_{OUT}$ functions as a source current such that it flows toward the output line 104 from the ground line 106 via the lower arm 114.

At the time point to, the low-side control signal LGCTL is set to the off level (low). The low-side driver circuit 260 generates the driving current $I_{HG\_OFF}$ (not shown in FIG. 3) so as to reduce the gate voltage $V_{LG}$ of the low-side transistor ML.

When the gate voltage $V_{LG}$ becomes lower than the threshold voltage $V_{GS(th)}$ of the MOSFET at the time point $t_1$, the low-side transistor ML is set to the off state. After the time point $t_1$, the state enters the high-impedance state φ1 in which both the high-side transistor MH and the low-side transistor ML are turned off.

At the time point $t_2$, the high-side control signal HGCTL transits to the on level (high). In this state, the negative lower arm current $I_{LO}$ flows through the flywheel diode Di of the lower arm 114. Accordingly, a reverse recovery current has the potential to occur. In this situation, the high-side driver circuit 220 operates in the first mode.

Specifically, during the first period $T_1$ from $t_2$ to $t_3$, the high-side driver circuit 220 outputs the driving current $I_{HG\_ON}$ with the first current amount $I_1$. With this, the gate-source voltage $V_{GS}(=V_{HG}-V_{OUT})$ of the high-side transistor MH increases with a first slope (first through rate).

During the second period $T_2$ from $t_3$ to $t_4$, the high-side driver circuit 220 reduces the driving current $I_{HG\_ON}$ to the second current amount 12. With this, the slope of the gate-source voltage $V_{GS}$ of the high-side transistor MH becomes very small. With this, the on resistance of the high-side transistor MH decreases very slowly. Such a large on resistance of the high-side transistor MH functions as a brake on the reverse recovery current.

At the time point $t_P$, a peak occurs in the reverse recovery current. The terminal point $t_4$ of the second period $T_2$ is preferably designed to be positioned after the peak time point $t_P$ of the reverse recovery current. During the third period $T_3$ from $t_4$ to $t_5$, the high-side driver circuit 220 increases the driving current $I_{HG\_ON}$ from the second current amount $I_2$ to the third current amount $I_3$. This allows the high-side driver circuit 220 to have improved performance, thereby accelerating the turn-on of the high-side transistor MH. This allows the high-side transistor MH to turn on completely. Accordingly, the output voltage $V_{OUT}$ is increased to the high-level voltage (e.g., $V_{IN}$=24 V), thereby completing the transition. After the completion of transition (after $t_5$), a high-level voltage (e.g., $V_{IN}$=12 V) is directly applied to the gate of the high-side transistor MH, thereby fixedly setting the gate-source voltage $V_{GS}$ to the high-level voltage.

The above is the operation of the switching circuit 100. With the switching circuit 100, this is capable of preventing through current flowing due to the reverse recovery current. With this, as shown in FIG. 3, no ringing occurs in the output voltage $V_{OUT}$.

The advantages of the switching circuit 100 can be clearly understood in comparison with conventional techniques. In the comparison technique, the high-side driver circuit 220 outputs a constant current in the source-rise situation as in the second mode.

Figure 4:
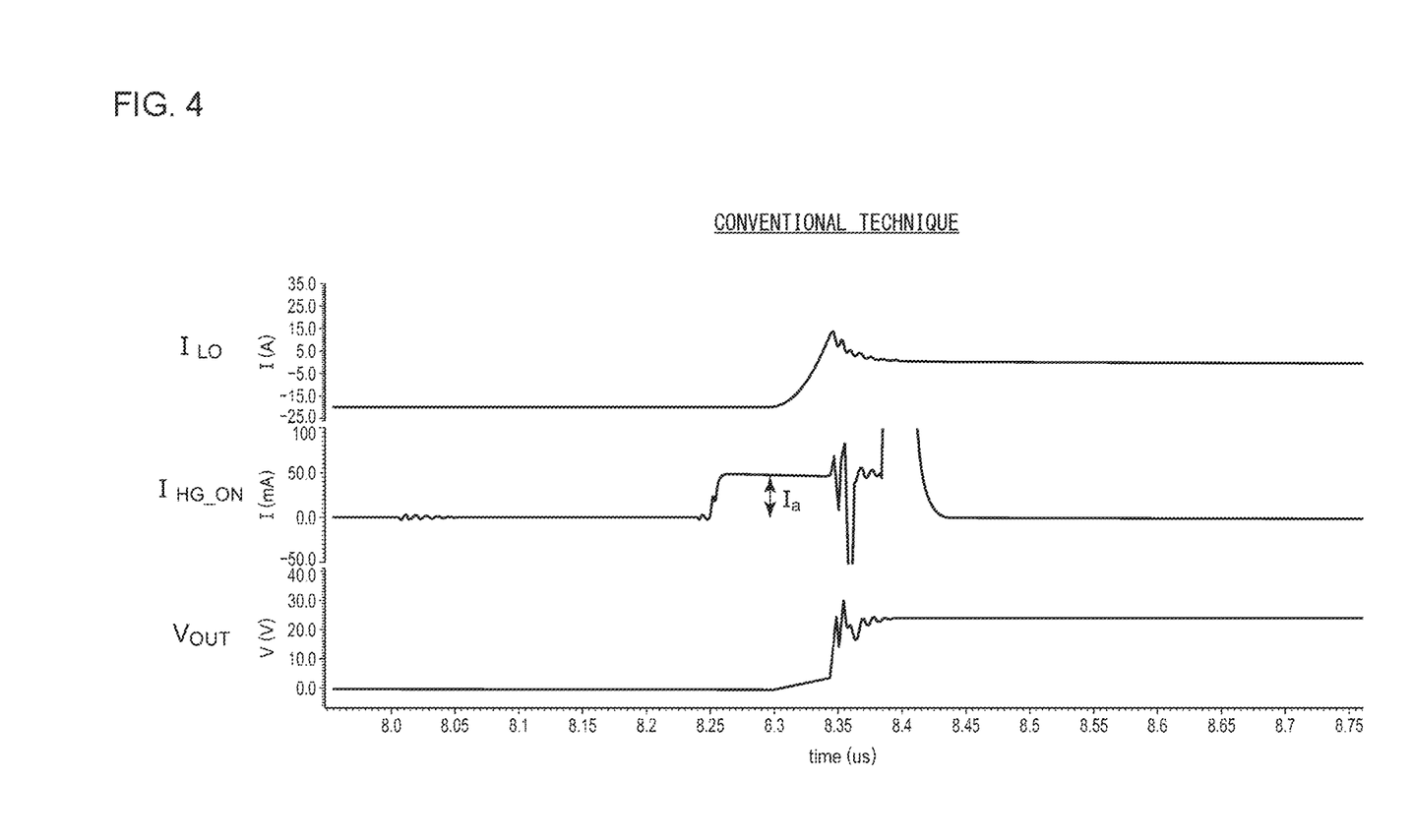
FIG. 4 is a waveform diagram (simulation results) of the operation of a comparison technique.

FIG. 4 is a waveform diagram (simulation results) in the comparison technique. In the comparison technique, the high-side driver circuit 220 supplies a current Ia with a constant current amount to the gate of the high-side transistor MH. In this case, the output current $I_{OUT}$ suddenly increases significantly due to the reverse recovery current that occurs in the flywheel diode of the low-side transistor ML. The perk current thereof rises on the order of 13 A. Furthermore, large ringing occurs in the output voltage $V_{OUT}$.

In comparison with such a comparison technique, in the present embodiment, the switching circuit 100 is operated in the first mode in the sink-rise situation. This allows the peak of the current $I_{LO}$ that flows through the lower arm 114, i.e., the peak of the output current $I_{OUT}$, to be suppressed from 13 A shown in FIG. 4 to 4.5 A shown in FIG. 3. Furthermore, this suppresses the occurrence of ringing in the output voltage $V_{OUT}$.

There is no effect of the reverse recovery current on the transition with the initial state in which no current flows through the flywheel diode of the lower arm. In this case, the high-side driver circuit 220 selects the second mode that provides high driving performance instead of the first mode. This allows the on resistance of the high-side transistor MH to be reduced in a short period of time, thereby providing improved efficiency.

Figure 5:
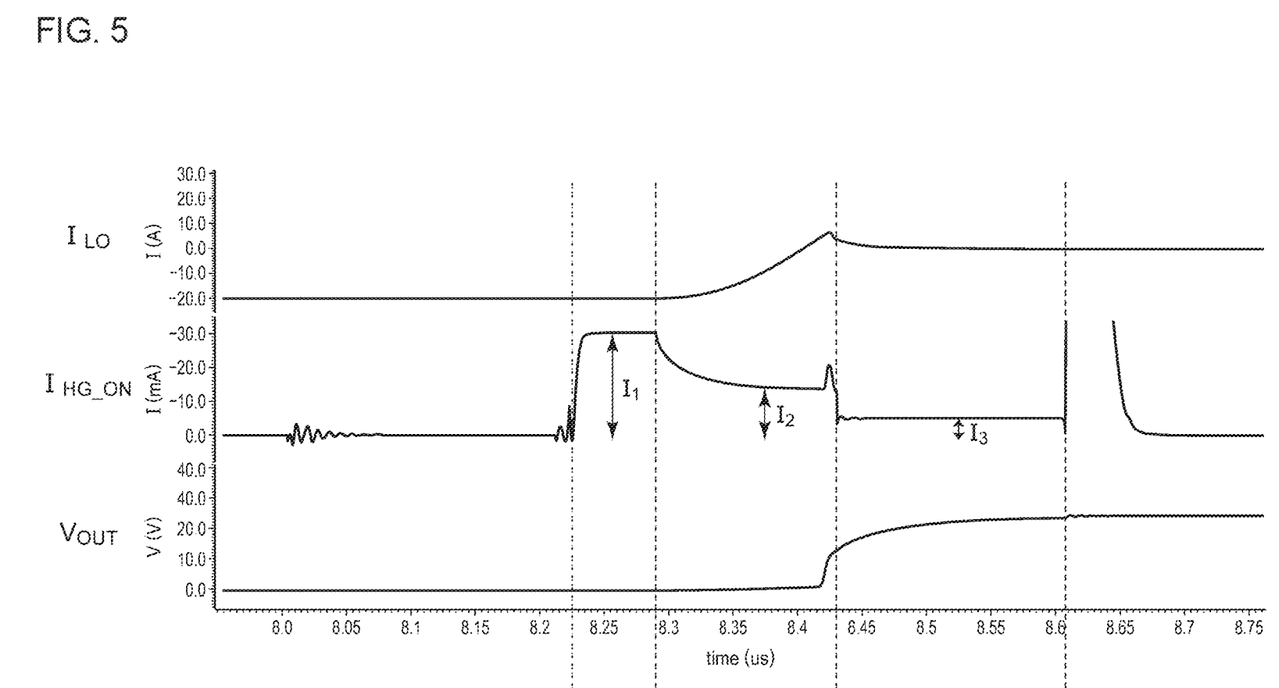
FIG. 5 is a waveform diagram (simulation results) of the operation of the switching circuit shown in FIG. 2 in a source-rise situation.

FIG. 5 is a waveform diagram (simulation results) showing the operation of the switching circuit 100 shown in FIG. 2 in the source-rise situation. In FIG. 5, the current amount $I_3$ of the driving current $I_{HG\_ON}$ in the third period $T_3$ is smaller than the current amount $I_2$ in the second period $T_2$.

In a case in which the reduced current amount $I_3$ is used in the third period $T_3$, this involves degraded efficiency. However, this is capable of suppressing the occurrence of ringing. That is to say, such an arrangement is capable of adjusting the waveform of the output voltage $V_{OUT}$ by adjusting the current amount $I_3$ in the third period $T_3$. It should be noted that, in a case in which $I_3=I_2$, such an arrangement is equivalent to an arrangement in which the waveform of the output voltage $V_{OUT}$ is controlled in two steps. In other words, in the control shown in FIG. 3, by setting the driving current $I_{HG\_ON}$ in the third period $T_3$ to the third current amount $I_3$ that is larger than the second current amount $I_2$, this allows the on resistance of the high-side transistor MH to be reduced in a short period of time, thereby providing the bridge circuit 110 with improved efficiency.

Next, description will be made regarding the operation of the low-side driver circuit 260.

In a situation in which the reverse recovery current of the flywheel diode of the upper arm 112 has the potential to occur, the low-side driver circuit 260 operates in the first mode. In a situation in which the reverse recovery current of the flywheel diode of the upper arm 112 has no potential to occur, the low-side driver circuit 260 operates in the second mode.

Specifically, the low-side driver circuit 260 operates in the first mode in a situation (sink-fall situation) in which the low-side transistor ML is to be turned on in the state φ1B in which both the high-side transistor MH and the low-side transistor ML are turned off, and the current $I_{OUT}$ is sunk via the flywheel diode Di of the upper arm 112.

Furthermore, the low-side driver circuit 260 operates in the second mode in a situation (source-fall situation) in which the low-side transistor ML is to be turned on in the state in which the high-side transistor MH is turned on and the low-side transistor ML is turned off, and the current $I_{OUT}$ is supplied as a source current via the high-side transistor MH.

Next, description will be made regarding an example configuration of the high-side driver circuit 220 and the low-side driver circuit 260.

Figure 6:
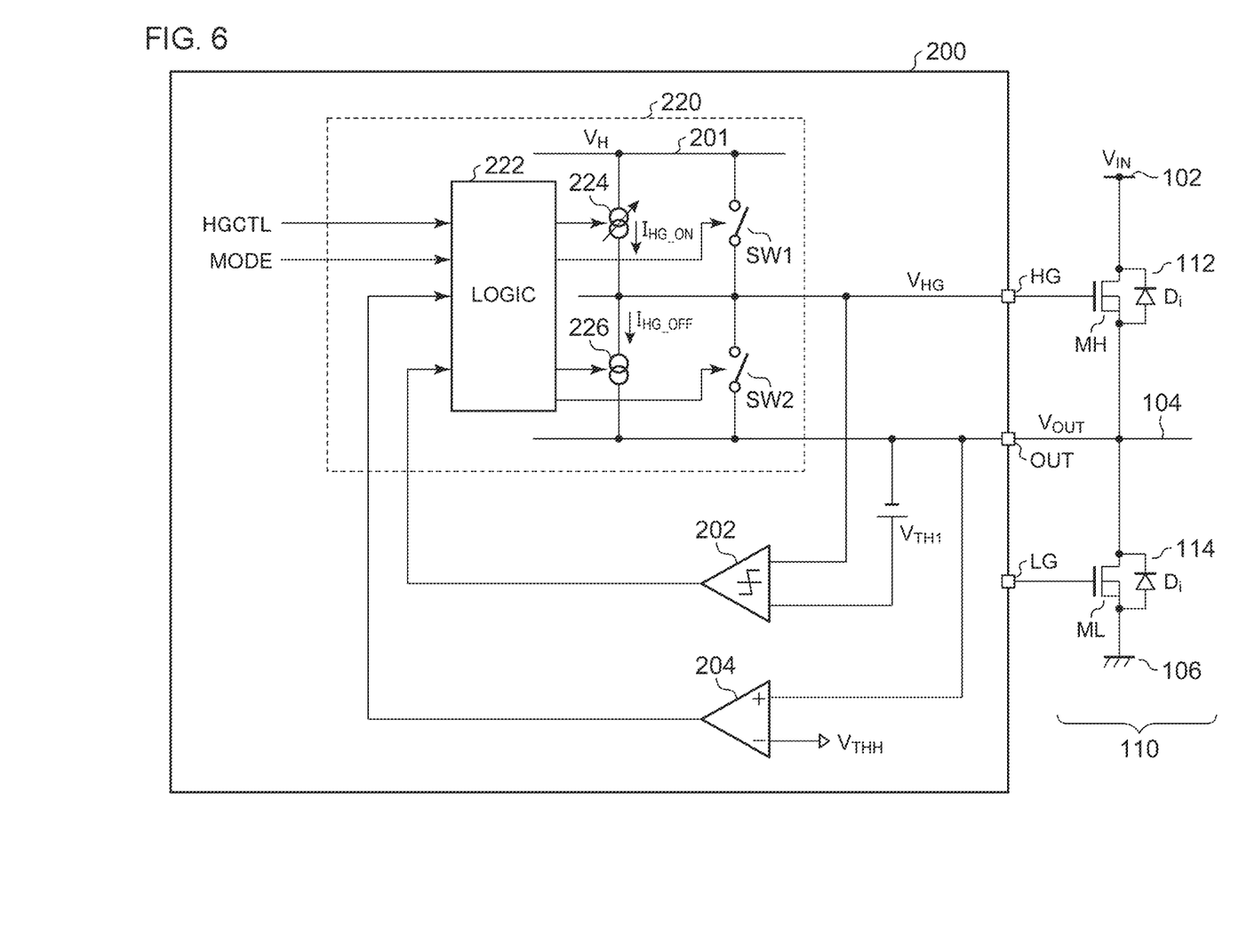
FIG. 6 is a circuit diagram showing an example configuration of a peripheral circuit of a high-side driver circuit of a driving circuit.

FIG. 6 is a circuit diagram showing an example configuration of a peripheral circuit of the high-side driver circuit 220 of the driving circuit 200.

The driving circuit 200 includes a first sensor 202 and a second sensor 204. The first sensor 202 compares the gate-source voltage $V_{GS}$ of the high-side transistor MH with a first threshold voltage $V_{TH1}$. The first threshold voltage $V_{TH1}$ may preferably be determined based on the threshold voltage $V_{GS(th)}$ of the MOSFET.

In many cases, the driving circuit 200 is provided with a high-side off sensor that detects whether or not the high-side transistor MH turns off. The output of the high-side off sensor is referenced by the control circuit 210 (not shown in FIG. 6). The control circuit 210 monitors the output of the high-side off sensor. After the high-side transistor MH turns off completely, the control circuit 210 switches the low-side control signal LGCTL to the on level. This is capable of preventing the high-side transistor MH and the low-side transistor ML from turning on at the same time, thereby preventing the occurrence of through current.

In a case in which the driving circuit 200 is provided with such a high-side off sensor, the first sensor 202 can be shared with the high-side off sensor. This allows the circuit area to be reduced.

When the output of the first sensor 202 changes, i.e., the gate-source voltage $V_{GS}$ of the high-side transistor MH exceeds the first threshold voltage $V_{TH1}$, in the first period $T_1$, the high-side driver circuit 220 transits to the second period $T_2$. In a case in which the first threshold voltage $V_{TH1}$ is set to a value that is lower than the threshold voltage $V_{GS(th)}$ of the MOSFET, such an arrangement allows the high-side driver circuit 220 to transit to the second period $T_2$ before the turn-on of the high-side transistor MH. In a case in which the high-side driver circuit 220 has a large response delay, the high-side driver circuit 220 transits to the second period $T_2$ at the same time as the turn-on or with a slight delay after the turn-on.

With such an arrangement in which the gate-source voltage $V_{GS}$ of the high-side transistor MH is monitored, such an arrangement is capable of changing the amount of the driving current $I_{HG\_ON}$ according to the transition of the high-side transistor MH from the off state to the on state.

The second sensor 204 compares the output voltage $V_{OUT}$ of the output line 104 with an upper-side threshold voltage $V_{THH}$. In the second period $T_2$, the high-side driver circuit 220 transits to the third period $T_3$ in response to the change in output of the second sensor 204. With such an arrangement in which the output voltage $V_{OUT}$ is monitored, such an arrangement is capable of detecting a reduction in the effects of the reverse recovery characteristics of the flywheel diode Di of the lower arm 114.

In some cases, the driving circuit 200 is provided with a sensor (voltage monitoring circuit) that compares the output voltage $V_{OUT}$ with a threshold voltage that is a predetermined voltage width lower than the input voltage $V_{IN}$ in order to detect whether or not the output voltage $V_{OUT}$ completely transits from the low level to the high level, or for other purposes. In this case, the voltage monitoring circuit is also configured as the second sensor 204, thereby suppressing an increase in the circuit area.

Next, specific description will be made regarding an example configuration of the high-side driver circuit 220. The high-side driver circuit 220 includes a logic circuit 222, current sources 224 and 226, and switches SW1 and SW2.

Relating to the turn-on of the high-side transistor MH, the first current source 224 and the first switch SW1 are provided. The first current source 224 is configured as a variable current source that is capable of controlling the output current $I_{HG\_ON}$ in multiple steps ($I_1$, $I_2$, $I_3$, and Ic). The configuration of the first current source 224 is not restricted in particular. The first current source 224 may include multiple current sources configured to be switchable between the on state and the off state. Also, the first current source 224 may be configured as a current DAC (D/A converter). The first switch SW1 is arranged between the gate of the high-side transistor MH and the power supply line 201 that receives the supply of the high-level voltage $V_H$ (>$V_{IN}$).

Relating to the turn-off of the high-side transistor MH, the second current source 226 and the second switch SW2 are provided. The second current source 226 is configured as a constant current source or a variable current source configured to output the current $I_{HG\_OFF}$. The second switch SW2 is arranged between the gate and the source of the high-side transistor MH.

The logic circuit 222 controls the current sources 224 and 226 and the switches SW1 and SW2 based on the high-side control signal HGCTL, a mode control signal MODE, the output of the first sensor 202, and the output of the second sensor 204. When the high-side control signal HGCTL is set to the on level, the logic circuit 222 instructs the first current source 224 and the first switch SW1 to operate so as to turn on the high-side transistor MH. Conversely, when the high-side control signal HGCTL is set to the off level, the logic circuit 222 instructs the second current source 226 and the second switch SW2 to operate so as to turn off the high-side transistor MH.

The mode control signal MODE is generated by the control circuit (not shown in FIG. 6). In the first mode, the logic circuit 222 sequentially transits from the first period $T_1$, to the second period $T_2$, and to the third period $T_3$, in this order, according to the output of the first sensor 202 and the output of the second sensor 204, so as to control the amount of current supplied from the current source 224. After the bridge circuit 110 transits completely, the logic circuit 222 turns on the first switch SW1 so as to fix the gate of the high-side transistor MH to the high-level voltage $V_H$.

It should be noted that the function of the logic circuit 222 may be provided to the control circuit 210 shown in FIG. 2.

Figure 7:
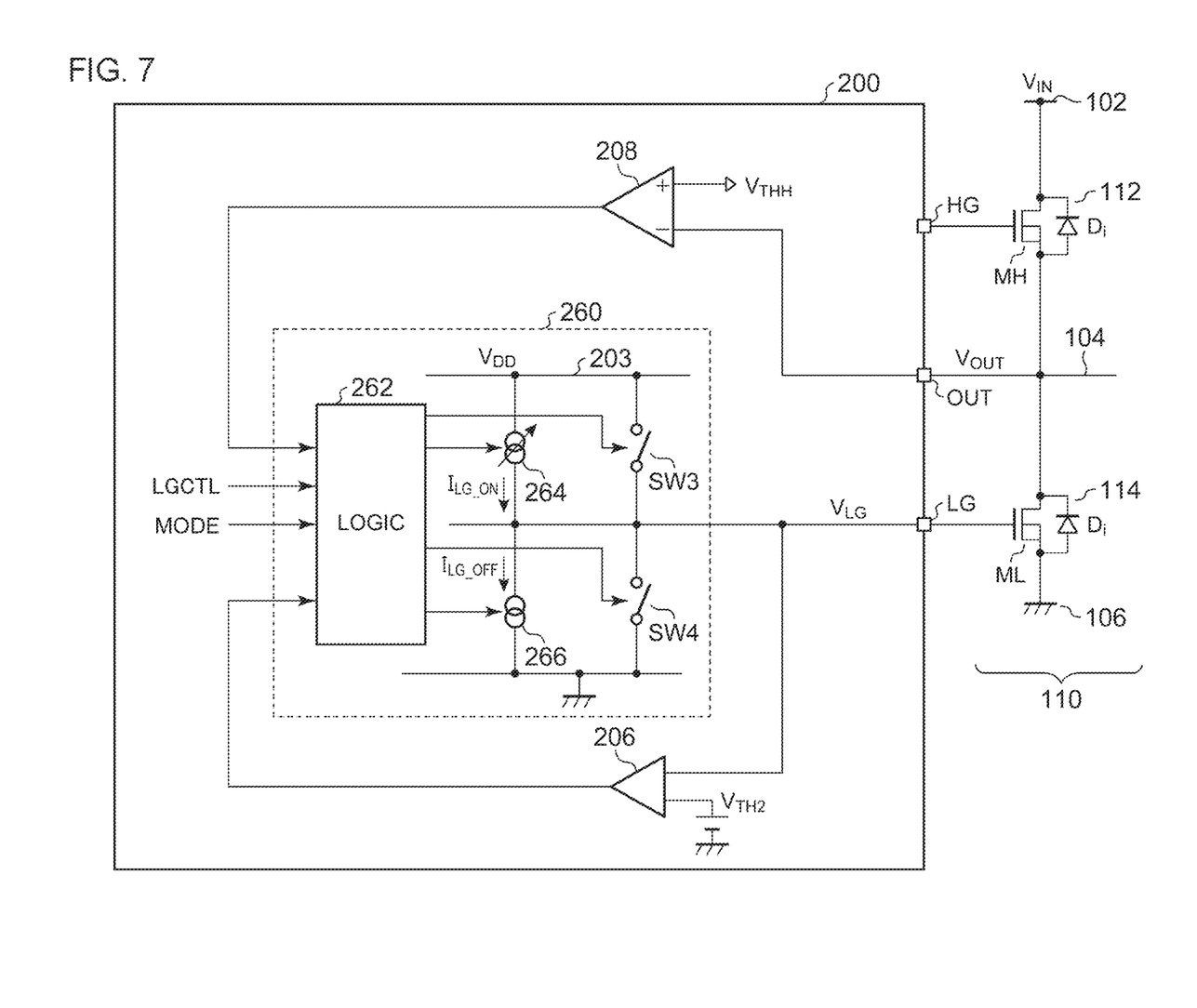
FIG. 7 is a circuit diagram showing an example configuration of a peripheral circuit of a low-side driver circuit of a driving circuit.

FIG. 7 is a circuit diagram showing an example configuration of a peripheral circuit of the low-side driver circuit 260 of the driving circuit 200. The driving circuit 200 includes a third sensor 206 and a fourth sensor 208. The third sensor 206 compares the gate-source voltage $V_{GS}$ of the low-side transistor ML with a second threshold voltage $V_{TH2}$. The second threshold voltage $V_{TH2}$ may preferably be determined based on the threshold voltage $V_{GS(th)}$ of the MOSFET.

In many cases, the driving circuit 200 is provided with a low-side off sensor that detects whether or not the low-side transistor ML turns off. The output of the low-side off sensor is referenced by the control circuit 210. The control circuit 210 monitors the output of the low-side off sensor. After the low-side transistor ML turns off completely, the control circuit 210 switches the high-side control signal HGCTL to the on level. This is capable of preventing the high-side transistor MH and the low-side transistor ML from turning on at the same time, thereby preventing the occurrence of through current.

In a case in which the driving circuit 200 is provided with such a low-side off sensor, the third sensor 206 can be shared with the low-side off sensor. This allows the circuit area to be reduced.

When the output of the third sensor 206 changes, i.e., the gate-source voltage $V_{GS}$ of the low-side transistor ML exceeds the second threshold voltage $V_{TH2}$, in the fourth period $T_4$, the low-side driver circuit 260 transits to the fifth period $T_5$. In a case in which the second threshold voltage $V_{TH2}$ is set to a value that is lower than the threshold voltage $V_{GS(th)}$ of the MOSFET, such an arrangement allows the low-side driver circuit 260 to transit to the fifth period $T_5$ before the turn-on of the low-side transistor ML. In a case in which the low-side driver circuit 260 has a large response delay, the low-side driver circuit 260 transits to the fifth period $T_5$ at the same time as the turn-on or with a slight delay after the turn-on.

With such an arrangement in which the gate-source voltage $V_{GS}$ of the low-side transistor ML is monitored, such an arrangement is capable of changing the amount of the driving current $I_{LG\_ON}$ according to the transition of the low-side transistor ML from the off state to the on state.

The fourth sensor 208 compares the output voltage $V_{OUT}$ of the output line 104 with an lower-side threshold voltage $V_{THL}$. In the fifth period $T_5$, the low-side driver circuit 260 transits to the sixth period $T_6$ in response to the change in output of the fourth sensor 208. With such an arrangement in which the output voltage $V_{OUT}$ is monitored, such an arrangement is capable of detecting a reduction in the effects of the reverse recovery characteristics of the flywheel diode Di of the upper arm 112.

In some cases, the driving circuit 200 is provided with a sensor (voltage monitoring circuit) that compares the output voltage $V_{OUT}$ with a threshold voltage that is a predetermined voltage width higher than the ground voltage (0 V) in order to detect whether or not the output voltage $V_{OUT}$ completely transits from the low level to the high level, or for other purposes. In this case, the voltage monitoring circuit is also configured as the fourth sensor 208, thereby suppressing an increase in the circuit area.

The low-side driver circuit 260 includes a logic circuit 262, current sources 264 and 266, and switches SW3 and SW4.

Relating to the turn-on of the low-side transistor ML, the third current source 264 and the third switch SW3 are provided. The third current source 264 is configured as a variable current source that is capable of controlling the output current $I_{LG\_ON}$ in multiple steps ($I_4$, $I_5$, $I_6$, and Id). The configuration of the third current source 264 is not restricted in particular. The third current source 264 may include multiple current sources configured to be switchable between the on state and the off state. Also, the third current source 264 may be configured as a current DAC (D/A converter). The third switch SW3 is arranged between the gate of the low-side transistor ML and the power supply line 203 that receives the supply of the power supply voltage $V_{DD}$.

Relating to the turn-off of the low-side transistor ML, the fourth current source 266 and the fourth switch SW4 are provided. The fourth current source 246 is configured as a constant current source or a variable current source configured to output the current $I_{LG\_OFF}$. The fourth switch SW4 is arranged between the gate and the source of the low-side transistor ML.

The logic circuit 262 controls the current sources 264 and 266 and the switches SW3 and SW4 based on the low-side control signal LGCTL, the mode control signal MODE, the output of the third sensor 206, and the output of the fourth sensor 208. When the low-side control signal LGCTL is set to the on level, the logic circuit 262 instructs the third current source 264 and the third switch SW3 to operate so as to turn on the low-side transistor ML. Conversely, when the low-side control signal LGCTL is set to the off level, the logic circuit 262 instructs the fourth current source 266 and the fourth switch SW4 to operate so as to turn off the low-side transistor ML.

The mode control signal MODE is generated by the control circuit 210 (not shown in FIG. 6). In the first mode, the logic circuit 262 sequentially transits from the fourth period $T_4$, to the fifth period $T_5$, and to the sixth period $T_6$, in this order, according to the output of the third sensor 206 and the output of the fourth sensor 208, so as to control the amount of current supplied from the current source 264. After the bridge circuit 110 transits completely, the logic circuit 262 turns on the third switch SW3 so as to fix the gate of the low-side transistor ML to the power supply voltage $V_{DD}$.

Next, description will be made regarding the usage of the switching circuit 100. The switching circuit 100 can preferably be employed in a driving circuit of a motor.

Figure 8:
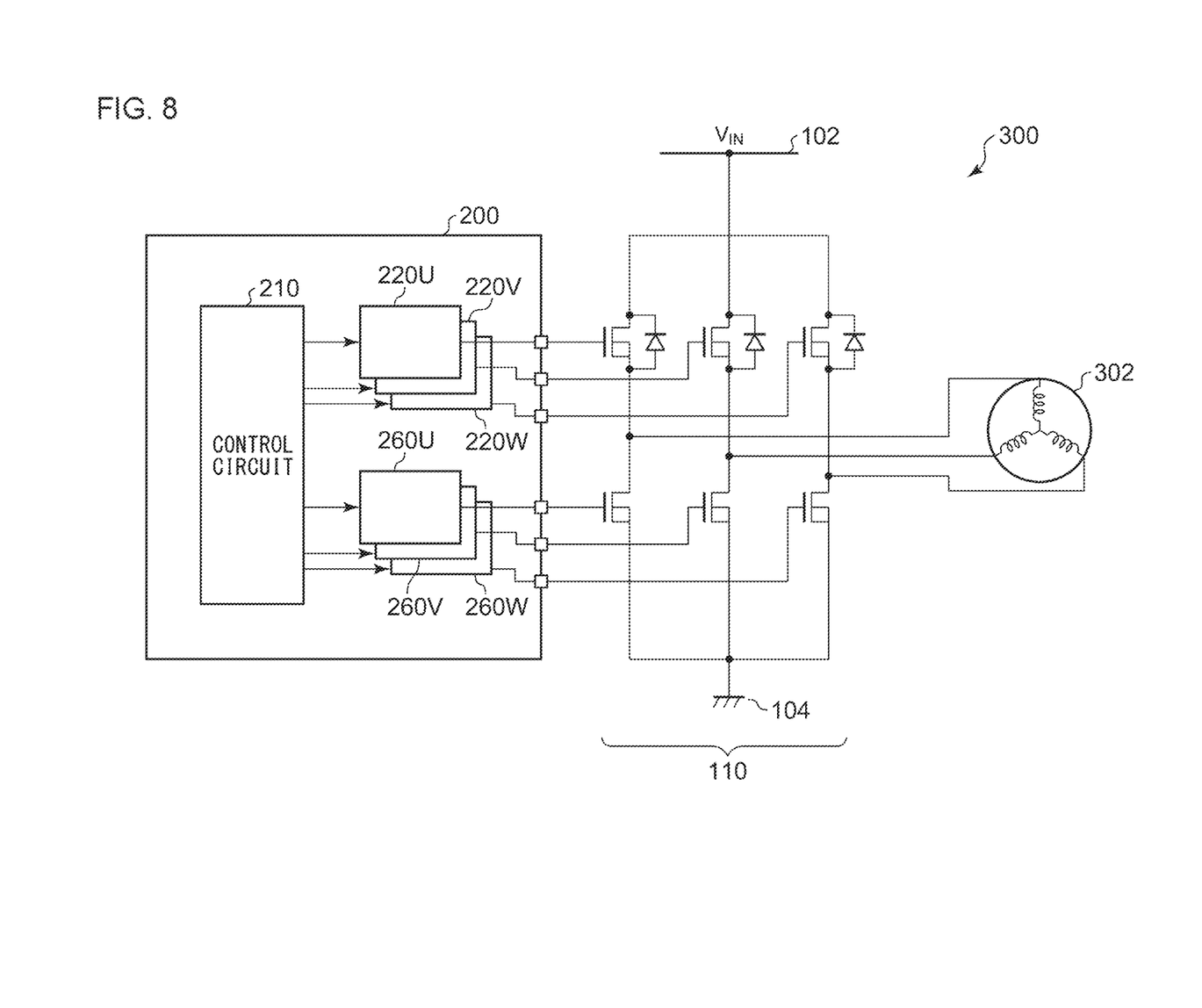
FIG. 8 is a circuit diagram of a motor driving apparatus provided with a switching circuit according to an embodiment.

FIG. 8 is a circuit diagram of a motor driving apparatus 300 provided with the switching circuit 100 according to an embodiment. The motor driving apparatus 300 drives a three-phase motor 302 configured as a load and controls the rotational state thereof.

The motor driving apparatus 300 includes a bridge circuit 110 and a driving circuit 200. The bridge circuit 110 is configured as a three-phase inverter including a U-phase leg, V-phase leg, and W-phase leg. Each phase leg includes an upper arm and a lower arm.

The driving circuit 200 includes a control circuit 210 and high-side driver circuits 220U through 220W, and low-side driver circuits 260U through 260W. The control circuit 210 generates control signals that indicate the states of the six arms that form the bridge circuit 110 based on the state of the three-phase motor 302 configured as a load.

The high-side driver circuits 220U through 220W are each configured to have the architecture of the high-side driver circuit 220 described above. Furthermore, the low-side driver circuits 260U through 260W are each configured to have the architecture of the low-side driver circuit 260 described above.

Description has been made above regarding the three-phase motor as an example. Also, the present invention is applicable to a single-phase motor. In this case, the bridge circuit 110 is configured as an H-bridge circuit.

Next, description will be made regarding the usage of the motor driving apparatus 300. The motor driving apparatus 300 can be used to control a spindle motor of a hard disk, and to control a lens driving motor of an imaging device. Also, the motor driving apparatus 300 can be used to drive a printer head driving motor and to drive a sheet-feeding motor. Also, the motor driving apparatus 300 can be employed to drive a motor of an electric vehicle, hybrid vehicle, etc.

The embodiments have been described for exemplary purposes only. Rather, it can be readily conceived by those skilled in this art that various modifications may be made by making various combinations of the aforementioned components or processes, which are also encompassed in the technical scope of the present disclosure or the present invention. Description will be made below regarding such modifications.

Modification 1

Description has been made in the embodiment regarding an arrangement in which the bridge circuit 110 is formed of discrete components. However, the present invention is not restricted to such an arrangement. Also, the bridge circuit 110 may be integrated on the driving circuit 200.

Modification 2

The upper arm 112 and the lower arm 114 may each be formed of an Insulated Gate Bipolar Transistor (IGBT).

Modification 3

Description has been made in the embodiment regarding an arrangement in which both the high-side driver circuit 220 and the low-side driver circuit 260 are configured to be capable of selecting one from among multiple modes. Also, only one of the high-side driver circuit 220 and the low-side driver circuit 260 may be configured to be capable of controlling the mode.

Modification 4

The usage of the switching circuit 100 is not restricted to the motor driving apparatus 300. For example, the switching circuit 100 is suitably employed for switching regulators (DC/DC converters), various kinds of power conversion apparatuses (inverters or converters), lighting inverters for discharge lamps, digital audio amplifiers, etc. Accordingly, the switching circuit 100 is applicable to consumer devices including electronic devices and consumer electronics devices, automobiles, in-vehicle components, industrial vehicles, and industrial equipment.

Description has been made regarding the present invention with reference to the embodiments using specific terms. However, the above-described embodiments show only an aspect of the mechanisms and applications of the present invention. Rather, various modifications and various changes in the layout can be made without departing from the spirit and scope of the present invention defined in appended claims.

Appendix

Item 1. A driving circuit structured to drive a bridge circuit comprising an upper arm having a high-side transistor and a flywheel diode coupled in parallel between a power supply line and an output line and a lower arm having a low-side transistor and a flywheel diode coupled in parallel between the output line and a ground line, the driving circuit comprising a high-side driver circuit having an output node coupled to a gate of the high-side transistor, and structured to operate in a first mode in which the high-side driver circuit outputs a driving current with a first current amount during a first period from a transition of a high-side control signal from an off level to an on level, and outputs the driving current with a second current amount that is smaller than the first current amount during a second period subsequent to the first period.

Item 2. The driving circuit according to item 1, further comprising a first sensor structured to compare a gate-source voltage of the high-side transistor with a first threshold voltage,
wherein the high-side driver circuit transits to the second period in response to a change in output of the first sensor in the first period.

Item 3. The driving circuit according to item 2, wherein the first sensor is configured such that it is shared with a high-side off sensor for detecting whether or not the high-side transistor turns off.

Item 4. The driving circuit according to item 1, wherein, in a third period subsequent to the second period, the high-side driver circuit outputs the driving current with a third current amount that is larger than the second current amount.

Item 5. The driving circuit according to item 4, further comprising a second sensor structured to compare an output voltage of the output line with an upper-side threshold voltage,
wherein the high-side driver circuit transits to the third period in response to a change in output of the second sensor in the second period.

Item 6. The driving circuit according to item 1, wherein, in a case in which the high-side transistor is to be turned on in a state in which both the high-side transistor and the low-side transistor are turned off, and a current is supplied as a source current via a flywheel diode of the lower arm, the high-side driver circuit operates in the first mode.

Item 7. The driving circuit according to item 1, wherein, in addition to the first mode, the high-side driver circuit is structured to operate in a second mode in which the high-side driver circuit outputs the driving current with a constant current amount that is larger than the second current amount during a period from a transition of the high-side control signal from the off level to the on level until completion of a state transition of the bridge circuit.

Item 8. The driving circuit according to item 7, wherein, in a case in which the high-side transistor is to be turned on in a state in which the high-side transistor is turned off and the low-side transistor is turned on, and a current is sunk via the low-side transistor, the high-side driver circuit operates in the second mode.

Item 9. The driving circuit according to item 1, wherein the high-side driver circuit comprises a first switch coupled between a gate and source of the high-side transistor, and structured to turn on after completion of a state transition of the bridge circuit.

Item 10. The driving circuit according to item 1, further comprising a low-side driver circuit having an output node coupled to a gate of the low-side transistor, and structured to operate in a first mode in which the low-side driver circuit outputs a driving current with a fourth current amount during a fourth period from a transition of a low-side control signal from the off level to the on level, and outputs the driving current with a fifth current amount that is smaller than the fourth current amount in a fifth period subsequent to the fourth period Item 11. The driving circuit according to item 10, further comprising a third sensor structured to compare a gate-source voltage of the low-side transistor with a third threshold voltage,
wherein the low-side driver circuit transits to the fifth period in response to a change in output of the third sensor in the fourth period.

Item 12. The driving circuit according to item 11, wherein the third sensor is configured such that it is shared with a low-side off sensor structured to detect whether the low-side transistor has turned off.

Item 13. The driving circuit according to item 10, wherein the low-side driver circuit outputs the driving current with a sixth current amount that is larger than the fifth current amount during a sixth period subsequent to the fifth period.

Item 14. The driving circuit according to item 13, further comprising a fourth sensor structured to compare an output voltage of the output line with a low-side threshold voltage, wherein the low-side driver circuit transits to the sixth period in response to a change in output of the fourth sensor in the fifth period.

Item 15. The driving circuit according to item 10, wherein, in a case in which the low-side transistor is to be turned on in a state in which both the high-side transistor and the low-side transistor are turned off, and a current is sunk via a flywheel diode of the upper arm, the low-side driver circuit operates in the first mode.

Item 16. The driving circuit according to item 10, wherein, in addition to the first mode, the low-side driver circuit is structured to operate in a second mode in which the low-side driver circuit outputs the driving current with a constant current amount that is larger than the fifth current amount during a period from a transition of the low-side control signal from the off level to the on level until completion of a state transition of the bridge circuit.

Item 17. The driving circuit according to item 16, wherein, in a case in which the low-side transistor is to be turned on in a state in which the high-side transistor is turned on and the low-side transistor is turned off, and a current is supplied as a source current via the high-side transistor, the low-side driver circuit operates in the second mode.

Item 18. The driving circuit according to item 10, wherein the low-side driver circuit comprises a second switch coupled between a gate and source of the low-side transistor, and structured to turn on after completion of a state transition of the bridge circuit.

Item 19. A driving circuit structured to drive a bridge circuit comprising an upper arm having a high-side transistor and a flywheel diode coupled in parallel between a power supply line and an output line and a lower arm having a low-side transistor and a flywheel diode coupled in parallel between the output line and a ground line, the driving circuit comprising a low-side driver circuit having an output node coupled to a gate of the low-side transistor, and structured to operate in a first mode in which the low-side driver circuit outputs a driving current with a fourth current amount during a fourth period from a transition of a low-side control signal from an off level to an on level, and outputs the driving current with a fifth current amount that is smaller than the fourth current amount during a fifth period subsequent to the fourth period.

Item 20. The driving circuit according to item 19, further comprising a third sensor structured to compare a gate-source voltage of the low-side transistor with a third threshold voltage,
wherein the low-side driver circuit transits to the fifth period in response to a change in output of the third sensor in the fourth period.

Item 21. The driving circuit according to item 20, wherein the third sensor is configured such that it is shared with a low-side off sensor for detecting whether or not the low-side transistor turns off.

Item 22. The driving circuit according to item 19, wherein, in a sixth period subsequent to the fifth period, the low-side driver circuit outputs the driving current with a sixth current amount that is larger than the fifth current amount.

Item 23. The driving circuit according to item 22, further comprising a fourth sensor structured to compare an output voltage of the output line with an lower-side threshold voltage,
wherein the low-side driver circuit transits to the sixth period in response to a change in output of the fourth sensor in the fifth period.

Item 24. The driving circuit according to item 19, wherein, in a case in which the low-side transistor is to be turned on in a state in which both the high-side transistor and the low-side transistor are turned off, and a current is sunk via a flywheel diode of the upper arm, the low-side driver circuit operates in the first mode.

Item 25. The driving circuit according to item 19, wherein, in addition to the first mode, the low-side driver circuit is structured to operate in a second mode in which the low-side driver circuit outputs the driving current with a constant current amount that is larger than the fifth current amount during a period from a transition of the low-side control signal from the off level to the on level until completion of a state transition of the bridge circuit.

Item 26. The driving circuit according to item 25, wherein, in a case in which the low-side transistor is to be turned on in a state in which the high-side transistor is turned on and the low-side transistor is turned off, and a current is supplied as a source current via the high-side transistor, the low-side driver circuit operates in the second mode.

Item 27. The driving circuit according to item 19, wherein the low-side driver circuit comprises a second switch coupled between a gate and source of the low-side transistor, and structured to turn on after completion of a state transition of the bridge circuit.

Item 28. A driving circuit structured to drive a bridge circuit comprising an upper arm having a high-side transistor and a flywheel diode coupled in parallel between a power supply line and an output line and a lower arm having a low-side transistor and a flywheel diode coupled in parallel between the output line and a ground line, the driving circuit comprising a high-side driver circuit that comprises an output node coupled to a gate of the high-side transistor, and that is structured to be switchable between a first mode and a second mode each defined such that there is a difference in a waveform of a driving current to be supplied to the gate of the high-side transistor between the first mode and the second mode.

Item 29. The driving circuit according to item 28, wherein, in a case in which the high-side transistor is to be turned on in a state in which both the high-side transistor and the low-side transistor are turned off, and a current is supplied as a source current via a flywheel diode of the lower arm, the high-side driver circuit operates in the first mode.

Item 30. The driving circuit according to item 28, wherein, in a case in which the high-side transistor is to be turned on in a state in which the high-side transistor is turned off and the low-side transistor is turned on, and a current is sunk via the low-side transistor, the high-side driver circuit operates in the second mode.

Item 31. A driving circuit structured to drive a bridge circuit comprising an upper arm having a high-side transistor and a flywheel diode coupled in parallel between a power supply line and an output line and a lower arm having a low-side transistor and a flywheel diode coupled in parallel between the output line and a ground line, the driving circuit comprising a low-side driver circuit having an output node coupled to a gate of the low-side transistor, and structured to be switchable between a first mode and a second mode each defined such that there is a difference in a waveform of a driving current to be supplied to the gate of the low-side transistor between the first mode and the second mode.

Item 32. The driving circuit according to item 31, wherein, in a case in which the low-side transistor is to be turned on in a state in which both the high-side transistor and the low-side transistor are turned off, and a current is sunk via a flywheel diode of the upper arm, the low-side driver circuit operates in the first mode.

Item 33. The driving circuit according to item 31, wherein, in a case in which the low-side transistor is to be turned on in a state in which the high-side transistor is turned on and the low-side transistor is turned off, and a current is supplied as a source current via the high-side transistor, the low-side driver circuit operates in the second mode.

Item 34. A motor driving apparatus comprising:
a bridge circuit having a high-side transistor and a low-side transistor; and
the driving circuit according to item 1, structured to drive the bridge circuit.

Item 35. An electronic device comprising:
a motor; and
the motor driving apparatus according to item 34, structured to drive the motor.

What is claimed is:

1. A driving circuit structured to drive a bridge circuit comprising an upper arm having a high-side transistor and a flywheel diode coupled in parallel between a power supply line and an output line and a lower arm having a low-side transistor and a flywheel diode coupled in parallel between the output line and a ground line, the driving circuit comprising:
a high-side driver circuit having an output node coupled to a gate of the high-side transistor, and structured to operate in a first mode in which the high-side driver circuit outputs a driving current with a first current amount during a first period from a transition of a high-side control signal from an off level to an on level, and outputs the driving current with a second current amount that is smaller than the first current amount during a second period subsequent to the first period; and
a first sensor structured to compare a gate-source voltage of the high-side transistor with a first threshold voltage, wherein the high-side driver circuit is structured to transit to the second period in response to a change in output of the first sensor in the first period.

2. The driving circuit according to claim 1, wherein the first sensor is configured such that it is shared with a high-side off sensor for detecting whether or not the high-side transistor turns off.

3. The driving circuit according to claim 1, wherein, in a third period subsequent to the second period, the high-side driver circuit outputs the driving current with a third current amount that is larger than the second current amount.

4. The driving circuit according to claim 3, further comprising a second sensor structured to compare an output voltage of the output line with an upper-side threshold voltage,
wherein the high-side driver circuit transits to the third period in response to a change in output of the second sensor in the second period.

5. The driving circuit according to claim 1, wherein, in a case in which the high-side transistor is to be turned on in a state in which both the high-side transistor and the low-side transistor are turned off, and a current is supplied as a source current via a flywheel diode of the lower arm, the high-side driver circuit operates in the first mode.

6. The driving circuit according to claim 1, wherein, in addition to the first mode, the high-side driver circuit is structured to operate in a second mode in which the high-side driver circuit outputs the driving current with a constant current amount that is larger than the second current amount during a period from a transition of the high-side control signal from the off level to the on level until completion of a state transition of the bridge circuit.

7. The driving circuit according to claim 6, wherein, in a case in which the high-side transistor is to be turned on in a state in which the high-side transistor is turned off and the low-side transistor is turned on, and a current is sunk via the low-side transistor, the high-side driver circuit operates in the second mode.

8. The driving circuit according to claim 1, wherein the high-side driver circuit comprises a first switch coupled between a gate and source of the high-side transistor, and structured to turn on after completion of a state transition of the bridge circuit.

9. The driving circuit according to claim 1, further comprising a low-side driver circuit having an output node coupled to a gate of the low-side transistor, and structured to operate in a first mode in which the low-side driver circuit outputs a driving current with a fourth current amount during a fourth period from a transition of a low-side control signal from the off level to the on level, and outputs the driving current with a fifth current amount that is smaller than the fourth current amount in a fifth period subsequent to the fourth period.

10. The driving circuit according to claim 9, further comprising a third sensor structured to compare a gate-source voltage of the low-side transistor with a third threshold voltage,
wherein the low-side driver circuit transits to the fifth period in response to a change in output of the third sensor in the fourth period.

11. The driving circuit according to claim 10, wherein the third sensor is configured such that it is shared with a low-side off sensor structured to detect whether the low-side transistor has turned off.

12. The driving circuit according to claim 9, wherein the low-side driver circuit outputs the driving current with a sixth current amount that is larger than the fifth current amount during a sixth period subsequent to the fifth period.

13. The driving circuit according to claim 12, further comprising a fourth sensor structured to compare an output voltage of the output line with a low-side threshold voltage,
wherein the low-side driver circuit transits to the sixth period in response to a change in output of the fourth sensor in the fifth period.

14. The driving circuit according to claim 9, wherein, in a case in which the low-side transistor is to be turned on in a state in which both the high-side transistor and the low-side transistor are turned off, and a current is sunk via a flywheel diode of the upper arm, the low-side driver circuit operates in the first mode.

15. The driving circuit according to claim 9, wherein, in addition to the first mode, the low-side driver circuit is structured to operate in a second mode in which the low-side driver circuit outputs the driving current with a constant current amount that is larger than the fifth current amount during a period from a transition of the low-side control signal from the off level to the on level until completion of a state transition of the bridge circuit.

16. The driving circuit according to claim 15, wherein, in a case in which the low-side transistor is to be turned on in a state in which the high-side transistor is turned on and the low-side transistor is turned off, and a current is supplied as a source current via the high-side transistor, the low-side driver circuit operates in the second mode.

17. The driving circuit according to claim 9, wherein the low-side driver circuit comprises a second switch coupled between a gate and source of the low-side transistor, and structured to turn on after completion of a state transition of the bridge circuit.

18. A driving circuit structured to drive a bridge circuit comprising an upper arm having a high-side transistor and a flywheel diode coupled in parallel between a power supply line and an output line and a lower arm having a low-side transistor and a flywheel diode coupled in parallel between the output line and a ground line, the driving circuit comprising:

a high-side driver circuit having an output node coupled to a gate of the high-side transistor, and structured to operate in a first mode in which the high-side driver circuit outputs a driving current with a first current amount during a first period from a transition of a high-side control signal from an off level to an on level, and outputs the driving current with a second current amount that is smaller than the first current amount during a second period subsequent to the first period, wherein the high-side driver circuit is structured to output the driving current with a third current amount that is larger than the second current amount in a third period subsequent to the second period.

19. A driving circuit structured to drive a bridge circuit comprising an upper arm having a high-side transistor and a flywheel diode coupled in parallel between a power supply line and an output line and a lower arm having a low-side transistor and a flywheel diode coupled in parallel between the output line and a ground line, the driving circuit comprising:

a high-side driver circuit having an output node coupled to a gate of the high-side transistor, and structured to operate in a first mode in which the high-side driver circuit outputs a driving current with a first current amount during a first period from a transition of a high-side control signal from an off level to an on level, and outputs the driving current with a second current amount that is smaller than the first current amount during a second period subsequent to the first period, wherein, in addition to the first mode, the high-side driver circuit is structured to operate in a second mode in which the high-side driver circuit outputs the driving current with a constant current amount that is larger than the second current amount during a period from a transition of the high-side control signal from the off level to the on level until completion of a state transition of the bridge circuit.

\* \* \* \* \*